United States Patent
Chuang

(10) Patent No.: US 6,218,241 B1
(45) Date of Patent: Apr. 17, 2001

(54) FABRICATION METHOD FOR A COMPACT DRAM CELL

(75) Inventor: Shu-Ya Chuang, Hsinchu Hsien (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/536,595

(22) Filed: Mar. 28, 2000

(51) Int. Cl.[7] ............................................... H01L 21/8242
(52) U.S. Cl. ............................................ 438/253; 438/596
(58) Field of Search .................................... 438/253, 396, 438/595, 596, 655, 656, 657

(56) References Cited

U.S. PATENT DOCUMENTS 5,930,623 * 7/1999 Wu ........................................ 438/253
6,037,211 * 7/1999 Jeng et al. ........................... 438/253

* cited by examiner

Primary Examiner—Chandra Chaudhari
(74) Attorney, Agent, or Firm—Thomas, Kayden, Horstemeyer & Risley

(57) ABSTRACT

A fabrication method for a compact DRAM cell is described. The method includes forming a first doped polysilicon layer, a metal barrier layer, a second doped polysilicon layer, a metal silicide layer and a patterned silicon oxide layer on a semiconductor substrate. A first silicon nitride spacer is then formed on the sidewall of the patterned silicon oxide layer, followed by a removal of the patterned silicon oxide layer and parts of a metal silicide layer, the second doped polysilicon layer and the metal silicide layer to form an upper part of the gate. A second silicon nitride spacer is then formed on the sidewall of the upper part of the gate, followed by a removal of the exposed first doped polysilicon layer to form the lower part of the gate. A bit line contact and a node contact are subsequently formed on both side of the gate above the lower part of the gate.

19 Claims, 5 Drawing Sheets

FABRICATION METHOD FOR A COMPACT DRAM CELL

BACKGROUND OF THE INVENTION

1. Field of the Invention

The present invention relates to a method for fabricating a semiconductor device. More particularly, the present invention relates to a fabrication method for a compact DRAM cell.

2. Description of the Related Art

There is a continuing effort in the semiconductor industry to increase the integration density on a semiconductor device, for example, a Dynamic Random Access Memory device. The DRAM device is composed, in part, of an array of memory cells. Each DRAM cell is formed with a single pass transistor, typically a field effect transistor (FET) and a storage capacitor. The storage capacitor makes contact to one of the two source/drain areas of the FET and a bit line makes contact to the other source/drain area of each of the FET transistors.

There have been, however, many problems in developing highly integrated memory devices due to the physically imposed limitations of the semiconductor fabrication equipments and the semiconductor device itself. For example, in order to achieve a highly integrated memory device, there should be a decreased area for the DRAM cell. The bit line and the node contacts to the FET source/drain areas on the substrate must also be correspondingly reduced in size and are hence formed increasingly closer together. The scale down of the cell size, however, is limited by the alignment of the contact openings to the pass gate. A reduction of the cell dimension would normally result in a decrease of the processing window, and due to the resolution limitation of the current photolithography techniques, there is an increased risk factor that the insulation structure is etched leading to a current leakage. Especially in semiconductor device with Ultra Large Scale Integration over 256 Megabit DRAM, new technology is needed for forming a contact opening capable of securing an alignment margin for maintaining the insulation of the conductors because the width between the word lines and the width between the bit lines are as narrow as a minimum line width. Furthermore, a sufficient channel length must be maintained to provide the required current driving capability for the pass transistor. The increase in the device integration is thus inevitably followed by the problems of the current leakage and shorting of the conductors.

To better understand the nature of the problem in reducing the cell size, the fabrication of a DRAM cell according to the conventional practice is shown schematically in cross-sectional view in FIGS. 1A to 1E.

As shown in FIG. 1A, a semiconductor substrate 100 having isolation structures 102 formed thereon, such as the shallow trench isolation structures (STI) is provided. The isolation structures 102 partition the substrate 100 into active and non-active parts. Transistors 104 and 106 are formed on the substrate 100. The transistors 104 and 106 consist of a gate conductive layer 108, a gate oxide layer 110, source/drain part 112, a cap layer 116 and a silicon nitride spacer 114.

Referring to FIG. 1B, a dielectric layer 118 is formed over the substrate 100 covering the transistors 104, 106 and the isolating structures 102. Photolithgraphy and etching are then conducted to pattern the dielectric layer 118 to form a contact opening 120, exposing the source/drain part 112. A polysilicon layer 122 is further deposited into the contact opening 120 over the dielectric layer 118.

As shown in FIG. 1C, photolithography and etching are conducted again to pattern the polysilicon layer 122 to form a bit line 124 in the contact opening 120. Another dielectric layer 126 is formed over the dielectric layer 118.

Referring to FIG. 1D, the dielectric layers 126 and 118 are then patterned to form a node contact opening 128.

Continuing to FIG. 1E, a contact plug 130 is formed inside the node contact opening 128. A bottom electrode 134 is further formed over the contact plug 130.

As the level of integration of devices continues to increase, the bit line contact opening 120 and the node contact opening 128 are formed increasingly closer to each other, resulting in a shorting between the conductors to occur more frequently. Furthermore, due to the spatial resolution resulting from the light source used in photolithography, the alignment precision in forming the contact openings becomes limited. If the contact openings 128 are slightly misaligned, a portion of the isolating structure 102 may be etched leading to a leakage current. Additionally, as the device dimension decreases, the channel length must be correspondingly reduced in size. The short channel effect would become significant.

SUMMARY OF THE INVENTION

Based on the foregoing, the present invention provides a fabrication method for a compact DRAM cell, wherein the cell size may be reduced without compromising the channel length or the alignment margin of the contacts to the pass gate.

The present invention also provides a method of manufacturing a semiconductor device which is capable of securing the node contact and the bit line contact alignment margins so as to prevent the occurrence of the shorting phenomenon and the current leakage problem.

The present invention further provides a method for increasing the integration of a semiconductor device, wherein the channel length is scalable and is not restricted by the resolution limitations of the current photolithographic techniques.

In accordance with the present invention, as embodied and broadly described herein, a semiconductor substrate is provided. A gate insulating layer is then formed on the substrate, followed by sequentially forming a first doped polysilicon layer, a metal barrier layer, a second doped polysilicon layer, a metal silicide layer, a first oxide layer on the gate insulating layer. The first oxide layer is then patterned to expose a part of a surface of the metal silicide layer. Thereafter, a first silicon nitride spacer is formed on the side of the patterned first silicon oxide layer. The patterned first silicon oxide layer is further removed.

Subsequently, parts of the metal silicide layer, the second doped polysilicon layer, the metal barrier layer using the first silicon nitride spacer as a mask, wherein the first silicon nitride spacer and remaining parts of the metal silicide layer, the second doped polysilicon layer, the metal barrier layer form an upper of a pass gate. A second silicon nitride spacer is then formed on the sidewall of the upper part of the gate. After this, parts of the first doped polysilicon layer and the gate insulating layer are removed using the second silicon nitride spacer as a mask, wherein a remaining part of the first doped polysilcion layer and the underlying gate insulating layer form a lower part of the gate. A bit line contact subsequently formed on one side of the gate, wherein the bit line contact is formed above the lower part of the gate. A node contact is also formed on other side of the gate, wherein the node contact is also formed above the lower part of the gate.

According to this preferred embodiment of the present invention, the pass gate is formed with a narrow upper part and a wide lower part. An adequate channel length is thus maintained. Since the upper part of the pass gate is narrower, the contact openings can form closer to the pass gate without compromising the alignment margin of the contact openings to the pass gate. The potential problem of etching the insulation structure and leading to a current leakage is thus prevented. Furthermore, since the size of the pass gate is determined by the widths of the silicon nitride spacers, the manufacturing of the pass gate is easier to control. The pass gate can form having a considerable smaller feature size, and is not limited by the current lithographic resolution.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENT

The fabrication method of a compact DRAM cell, respectively in accordance with the present invention is described with reference to FIGS. 2A to 2F. FIGS. 2A to 2F represent a cross-sectional view showing various stages of a fabrication process of a compact DRAM cell according to one embodiment of the present invention.

Figure 1A:
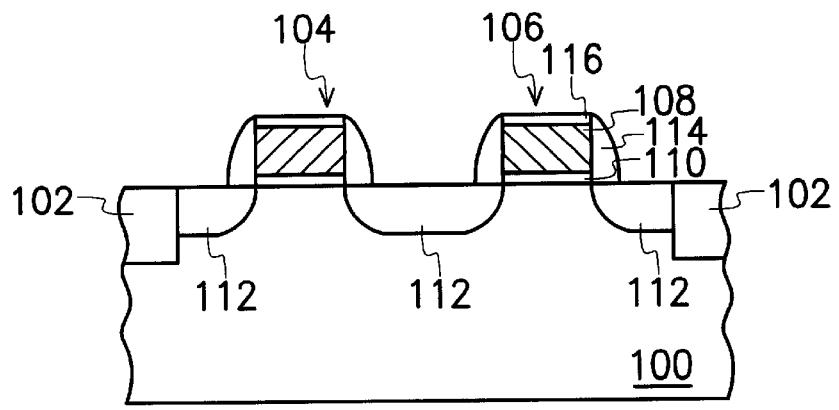
FIGS. 1A to 1E are schematic, cross-sectional views showing the manufacturing of a DRAM cell according to the prior art.
Figure 1B:
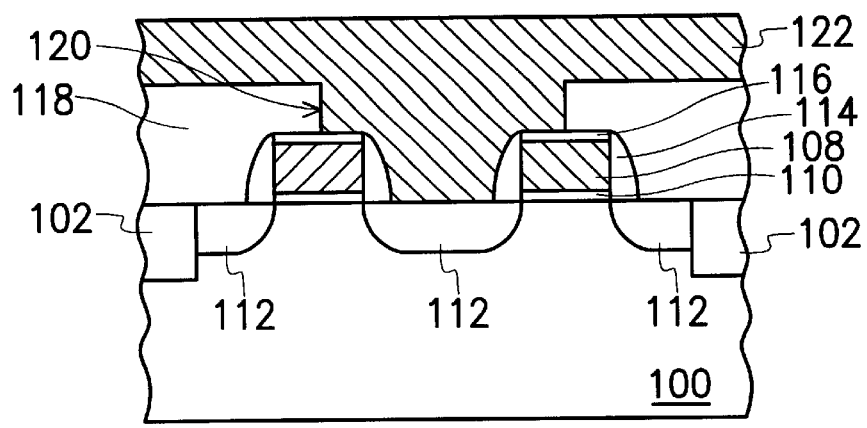
Figure 1C:
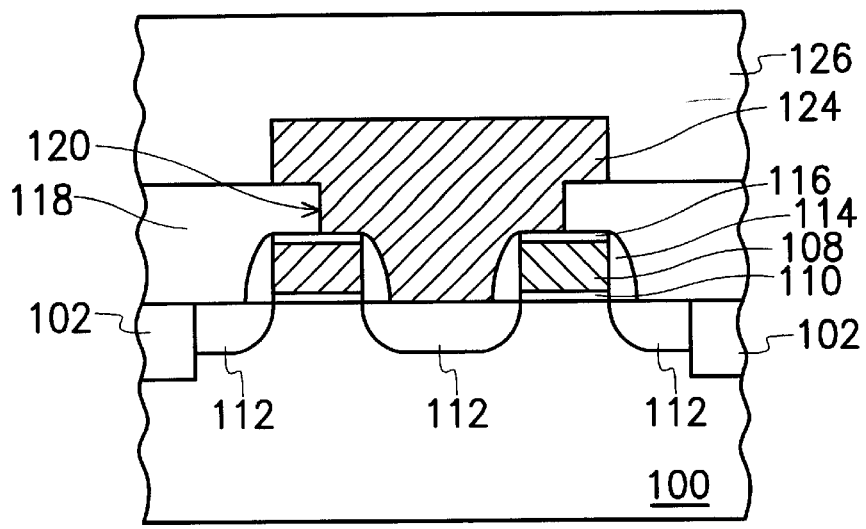
Figure 1D:
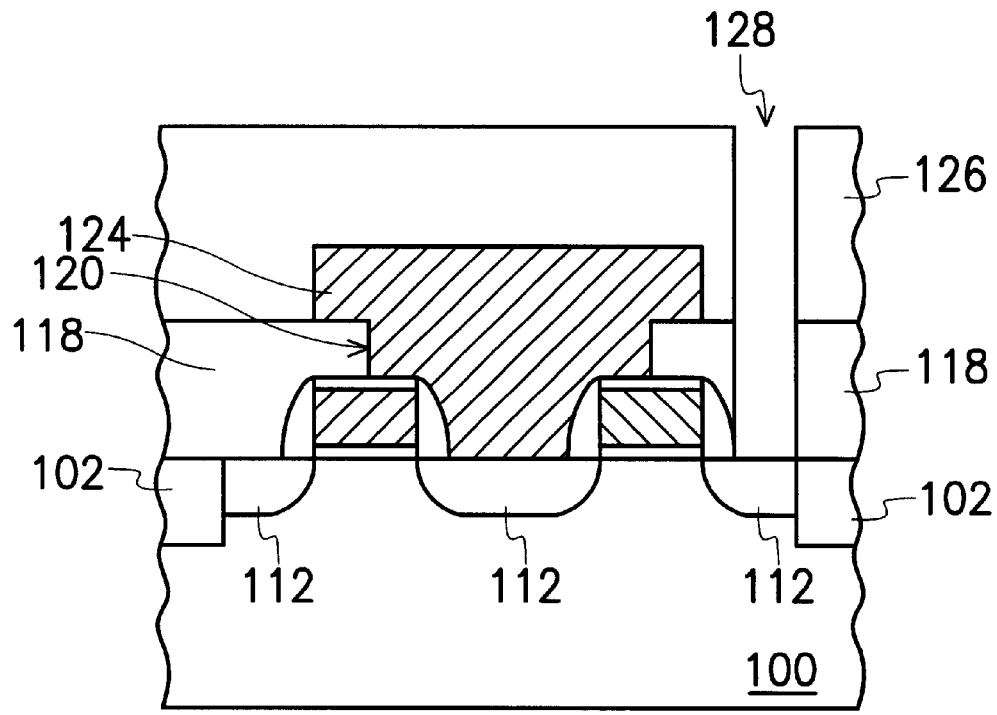
Figure 1E:
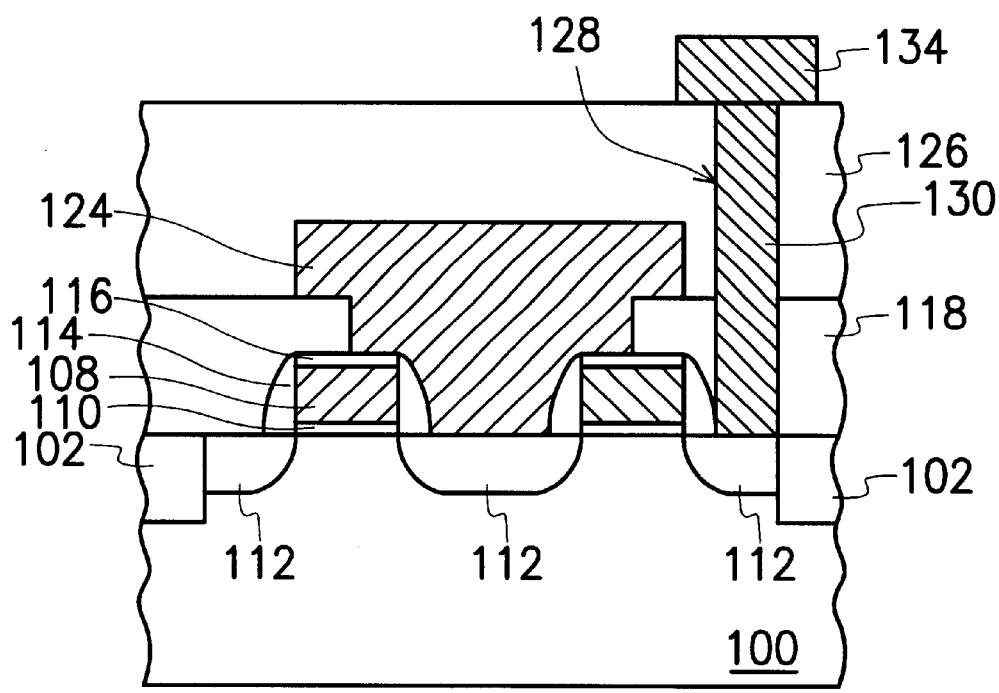
Figure 2A:
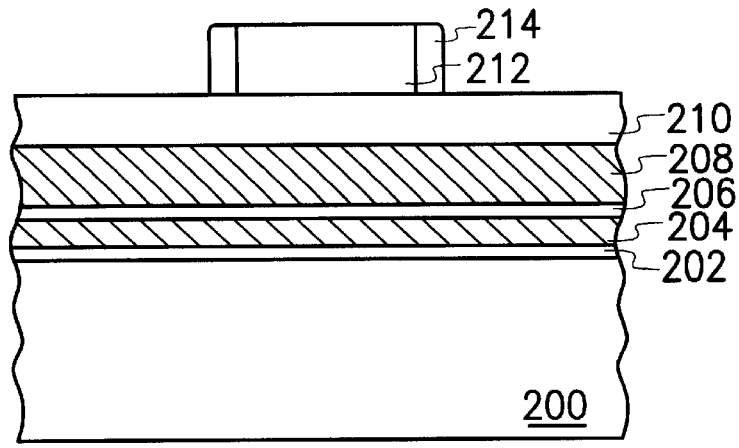
FIGS. 2A to 2F are schematic, cross-sectional views showing the manufacturing of a compact DRAM cell according to the preferred embodiment of the present invention.

Referring to FIG. 2A, a silicon substrate 200 is provided. The silicon substrate 200 is thermally oxidized to grow a gate oxide layer 202 on the silicon substrate 200. A doped polysilicon layer 204, a metal barrier layer 206, another doped polysilicon layer 208, a metal silicide layer 210 and a silicon oxide layer 212 are sequentially stacked on the silicon substrate 200. The doped polysilicon 204 and the doped polysilicon layer 208 can form by blanket depositing an undoped polysilicon layer, for example, by low pressure chemical vapor deposition (LPCVD), followed by implanting impurities to the undoped polysilicon layer. The metal barrier layer 206, such as titanium nitride, is formed by either chemical vapor deposition (CVD). The metal silicide layer 210, for example, a tungsten silicide layer (WSi$_2$), is formed by physical vapor deposition or sputtering deposition. The silicon oxide layer 212 is formed by, for example, chemical vapor deposition. Photolithography and etching are conducted to pattern the silicon oxide layer 212, exposing a part of the surface of the metal silicide layer 210.

Still referring to FIG. 2A, a blanket insulating layer (not shown in Figure), for example, a silicon nitride layer, is then formed, for example, by chemical vapor deposition on the entire surface of the resultant semiconductor structure. The insulating layer is then anisotropically etched back to form the silicon nitride spacers 214 on the sides of the patterned silicon oxide layer 212.

Figure 2B:
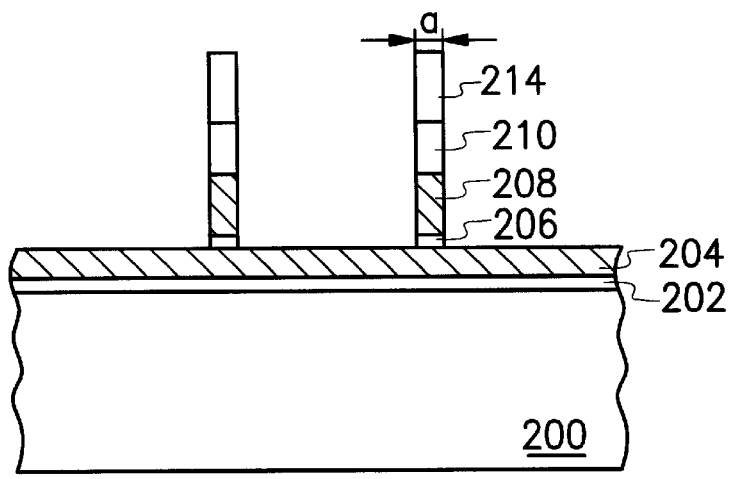

Continuing to FIG. 2B, the silicon oxide layer 212 is dipped away, for example, in hydrogen fluoride. Subsequent to the removal of the silicon oxide layer 212, parts of the metal silicide layer 210, the doped polysilicon layer 208 and the metal barrier layer 206 are removed using the silicon nitride spacers 214 as hard masks. The metal silicide layer 210, the doped polysilicon layer 208 and the metal barrier layer 206 are removed, for example, by dry etching, using the doped polysilicon layer 204 as an etch stop. The remaining metal silicide layer 210, the doped polysilicon layer 208 and the metal barrier layer 206 have a width which corresponds to the width of the silicon nitride spacers 214, denoted as "a" in FIG. 2B.

Figure 2C:
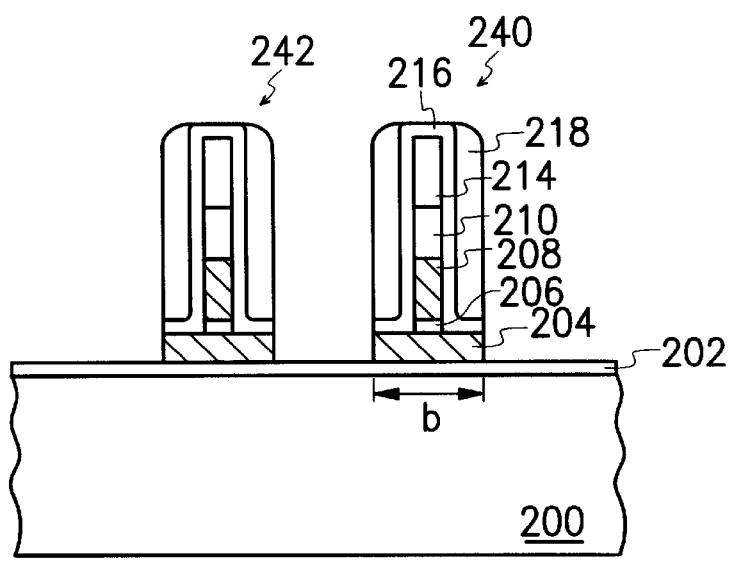

As shown in FIG. 2C, a conformal silicon oxide layer 216 is formed, for example, by chemical vapor deposition, to cover the exposed surfaces of the doped polysilicon layer 204, the silicon nitride layer 214, the metal silicide layer 210, the doped polysilicon layer 208 and the metal barrier layer 206. A blanket insulating layer, for example, a silicon nitride layer, is again formed, for example, by chemical vapor deposition, on the entire surface of the resultant semiconductor structure. The insulating layer is then anisotropically etched back to form the silicon nitride spacers 218 on the conformal silicon oxide layer 216 that covers the sides of the first silicon nitride layer 214, the metal silicide layer 210, the second doped polysilicon layer 208 and the metal barrier layer 206, and a part of the doped polysilicon layer 204.

Still referring to FIG. 2C, using the silicon nitride spacers 218 as masks, the exposed parts of the conformal silicon oxide layer 216 and the underlying doped polysilicon layer 204 are removed to form a plurality of the pass gates 240, 242. The pass gates 240, 242 are formed having a narrow upper part and a wide lower part. The upper part of the pass gates 240, 242, which comprises the metal barrier layer 206, the doped polysilicon layer 208, the metal silicide layer 210 and the silicon nitride spacer 214, has a width that corresponds to the width "a" of the silicon nitride spacer 214. The lower part of the pass gates 240, 242, which comprises the doped polysilicon layer 204 and gate oxide layer 202, has a width denoted as "b". The width of the pass gate 240, 242 or the channel length is thus equal to "b" and is dependent on the widths of the silicon nitride spacers 214 and 218. The channel length "b" is equal to "a"+(width of the silicon oxide layer 216)*2+(width of the silicon nitride spacers 218)*2.

Figure 2D:
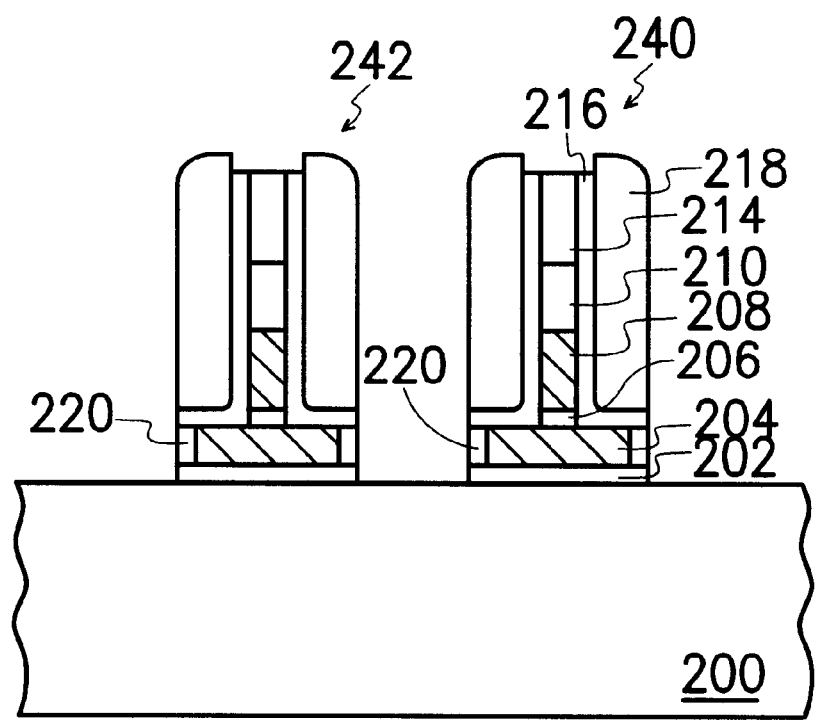

Referring to FIG. 2D, an oxide layer 220 is formed on the sides of the doped polysilicon layer 204. The oxide layer 220 is formed by growing a silicon oxide layer, for example, by thermal oxidation, on the surface of the silicon substrate 200 and on the sides of the first doped polysilicon layer 204. The exposed silicon oxide layer and the gate oxide layer 202 on the silicon substrate 200 are then removed, for example, by dry etching, leaving the oxide layer 220 on the sides of the doped polysilicon layer 204. The portion of the silicon oxide layer 216 not covered by the silicon nitride spacers 218 is also eventually removed in the dry etching process.

Figure 2E:
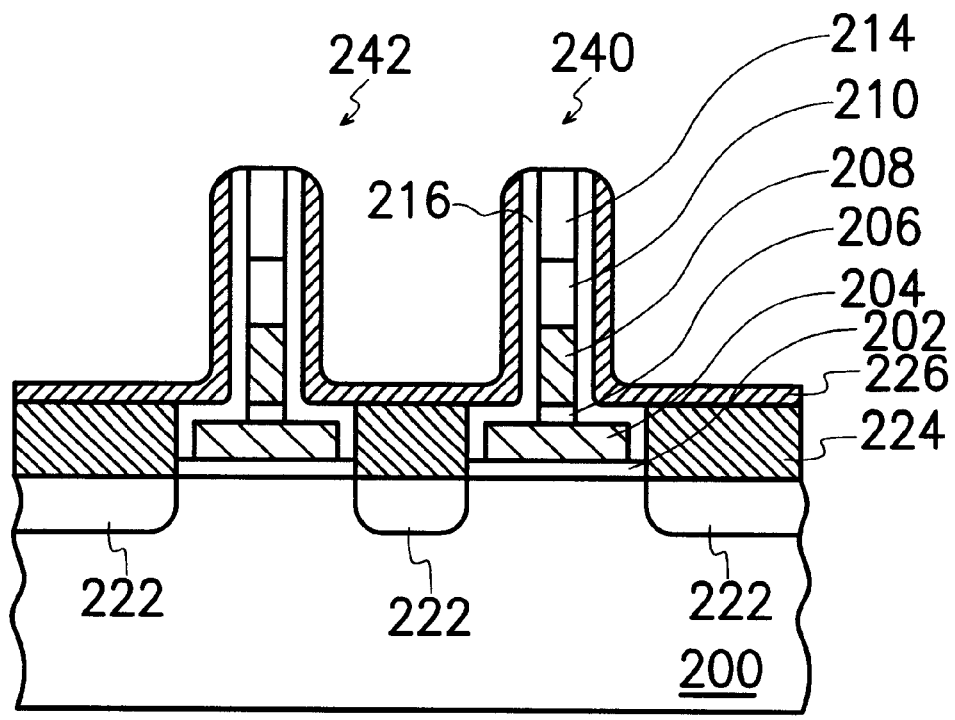

Continuing to FIG. 2E, a doped polysilicon layer 224 is then formed on the exposed silicon substrate 200 adjacent to the lower part of the pass gates 240, 242. The doped polysilicon layer 224 is formed by, for example, low pressure chemically vapor depositing a layer of doped polysilicon on the surface of the resultant semiconductor structure and etching back the doped polysilicon layer to about the surface of the silicon oxide layer 216 on the doped polysilicon layer 204. Either proceeding to the formation or the auto-doping of the doped polysilicon layer 224, an ion implantation of the p-type (boron) or the n-type (phosphorous or arsenic) impurities and thermal annealing are conducted. Through the ion implantation and the thermal annealing, the source/drain regions 222 are formed in the silicon substrate 200 on both sides of the pass gates 240, 242.

Still referring to FIG. 2E, the silicon nitride spacers 218 (as in FIG. 2D) are removed, for example, by dry etching or wet etching. A doped polysilicon layer (not shown in Figure) is formed, for example, by chemical vapor deposition, to provide a planar surface on the entire surface of the resultant semiconductor structure. The doped polysilicon layer is then patterned to form a conformal doped polysilicon layer 226 as a contacting pad covering the doped polysilicon layer 224 and the silicon oxide layer 216.

Figure 2F:
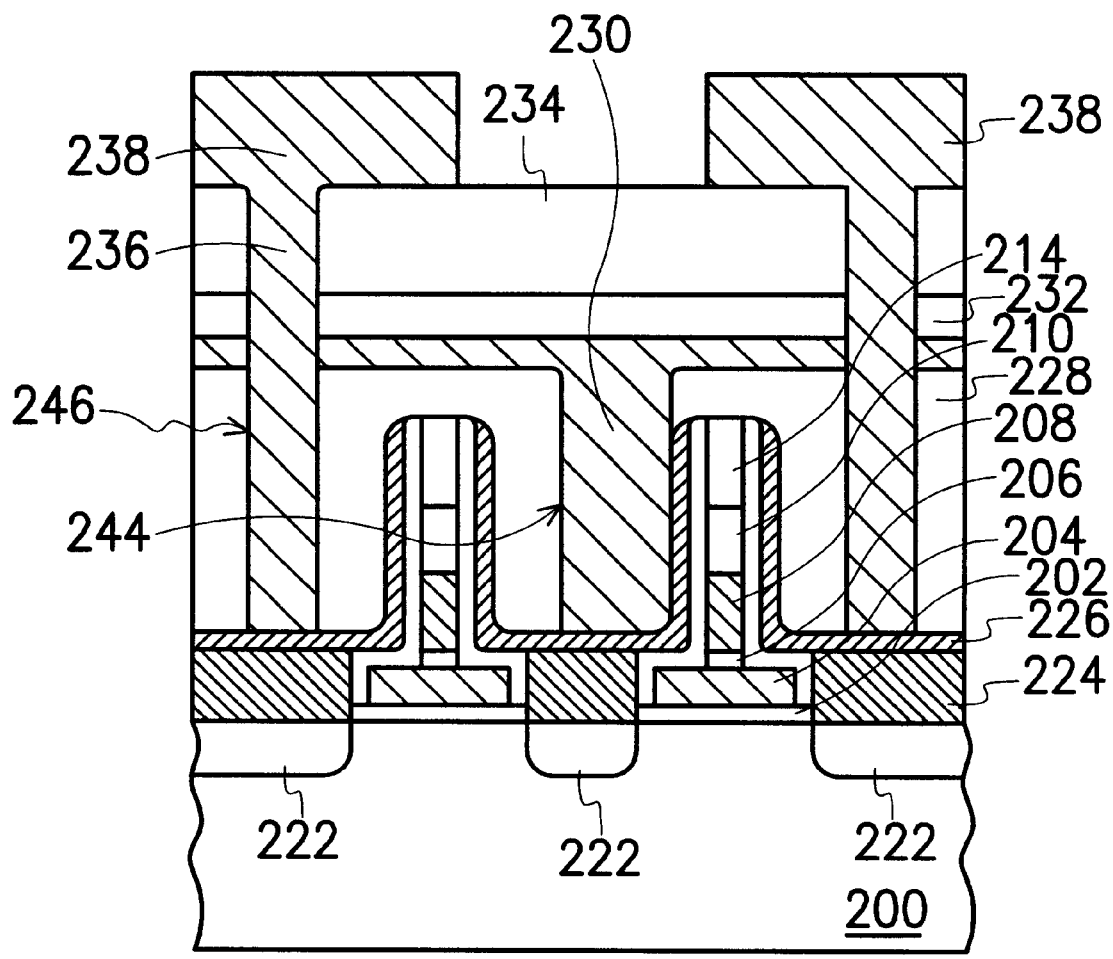

Subsequently, the bit line contact and the node contact are formed as commonly practiced in the semiconductor industry. As shown in FIG. 2F, a dielectric layer 228 is formed over the silicon substrate 200, covering the pass gates 240, 242. The dielectric layer 228 are then patterned by the common photolithography and etching techniques to form a bit line contact opening 244 on one side of the pass gates 240, 242. The bit line contact opening 244 is formed above the lower part of the pass gates 240, 242, exposing the doped polysilicon layer 226 that lies above the source/drain region 222. A conductive material, for example, polysilicon, is then deposited into the bit line contact opening 244 and over the dielectric layer 228 to form a bit line 230. A metal silicide layer 232 and another dielectric layer 234 are further sequentially formed, for example, by chemical vapor deposition, over the bit line 230 and the dielectric layer 228. The dielectric layers 228 and 234 are further patterned to form a node contact opening 246 on another sides of the pass gates 240, 242. The node contact opening 246 is also formed above the lower part of the pass gates 240, 242, exposing the doped polysilicon layer 226 that lies above the source/drain region 222. A contact plug 236 is then formed inside the node contact opening 246. A bottom electrode 238 is subsequently formed over the contact plug 236.

Accordingly, the pass gate of the present invention is formed with a narrow upper part and a wide lower part. An adequate channel length is thereby maintained, preventing the short channel effect. Since the upper part of the pass gate is narrower, the bit line contact and node contact can form closer to the pass gates without compromising the alignment margins of the contacts to the pass gates. A shorting of the conductors is thereby prevented. The potential problem of a current leakage due to a misalignment of the contact opening is also being avoided.

Furthermore, the size of the pass gate is determined by the widths of the silicon nitride spacers. The scalability of the pass gate is thus easier to control and is not limited by the current lithographic resolution. As a result, the integration density of a semiconductor device can be increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method for a compact DRAM cell, wherein a silicon substrate is provided, the method comprising:

forming a gate oxide layer on the silicon substrate;

forming sequentially a first doped polysilicon layer, a titanium nitride layer, a second doped polysilicon layer, a tungsten silicide layer and a patterned first silicon oxide layer on the gate oxide layer;

forming a first silicon nitride spacer on a sidewall of the patterned first silicon oxide layer;

removing the patterned first silicon oxide layer;

removing parts of the tungsten silicide layer, the second doped polysilicon layer, the titanium nitride layer using the first silicon nitride spacer as a mask;

forming a conformal second silicon oxide layer to cover exposed surfaces of the first doped polysilicon layer, the first silicon nitride spacer, the tungsten silicide layer, the second doped polysilicon layer and the titanium nitride layer;

forming a second silicon nitride spacer on a part of the conformal second silicon oxide layer that covers sides of the first silicon nitride spacer, the tungsten silicide layer, the second doped polysilicon layer and the titanium nitride layer, and on a part of a surface of the first doped polysilicon layer;

removing exposed portions of the conformal second silicon oxide layer and the underlying first doped polysilicon layer to form a pass gate using the second silicon nitride spacer as a mask;

forming a third silicon oxide layer on a side of the first doped polysilicon layer;

forming a plurality of source/drain regions in the the silicon substrate on both sides of the pass gate;

forming a third doped polysilicon layer on the substrate on both sides of the pass gate;

removing the second silicon nitride spacer;

forming a conformal fourth doped polysilicon layer on the third doped polysilicon layer and on the second silicon oxide layer that covers sides of the pass gate;

forming a bit line to contact with one of the source/drain regions;

forming a node contact plug to make contact with one of the source drain region; and forming a bottom electrode over the node contact plug.

2. The method according to claim 1, wherein the first silicon nitride spacer is formed by:

blanket depositing a silicon nitride layer on an entire surface of the silicon substrate, covering the patterned first silicon oxide layer and the exposed surface of the tungsten silicide layer; and back etching the silicon nitride layer to a width of "a" on the sidewall of the patterned first silicon oxide layer.

3. The method according to claim 1, wherein the patterned first silicon oxide layer is removed by dipping away in hydrogen fluoride.

4. The method according to claim 1, wherein after the removal of parts of the tungsten silicide layer, the second doped polysilicon layer and the titanium nitride layer, the first silicon nitride spacer and remaining parts of the tungsten silicide layer, the second doped polysilicon layer, the titanium nitride layer form an upper part of the pass gate.

5. The method according to claim 4, wherein a width of the upper part of the pass gate depends on a width of the first silicon nitride spacer.

6. The method according to claim 1, wherein after the removal of parts of the conformal second silicon oxide layer and the underlying first doped polysilicon layer, remaining parts of the first doped polysilicon layer and the underlying gate oxide layer form a lower part of the pass gate.

7. The method according to claim 6, wherein a width of the lower part of the pass gate depends on the width of the first silicon nitride spacer and a width of the second silicon nitride spacer.

8. The method according to claim 7, wherein the width of the lower part of the pass gate is greater than the width of the upper part of the pass gate.

9. The method according to claim 1, wherein the third silicon oxide layer is formed by thermal oxidation.

10. The method according to claim 1, wherein the source/drain regions can form before an auto-doping of the third doped polysilicon layer.

11. The method according to claim 1, wherein the conformal fourth doped polysilicon layer serves as a contacting pad.

12. The method according to claim 1, wherein the bit line contact and the node contact plug are formed by:
   forming a first dielectric layer over the silicon substrate, covering the pass gate and the conformal fourth doped polysilicon layer;
   patterning the first dielectric layer to form a bit line contact opening on one side of the pass gate, wherein the bit line contact opening exposes a portion of the fourth doped polysilicon layer overlying the third doped polysilicon layer;
   filling the bit line contact opening with a conductive material to for a bit line contact;
   forming a second dielectric layer over the first dielectric layer;
   patterning the first dielectric layer and the second dielectric layer to form a node contact opening on another side of the pass gate, wherein the node contact opening exposes a portion of the fourth doped polysilicon layer overlying the third doped polysilicon layer; and
   forming a node contact plug in the node contact opening.

13. A method for increasing the integration of a semiconductor device, wherein the method is applicable to a fabrication of a DRAM device, the method compromising:
   forming sequentially a gate oxide layer, a first doped polysilicon layer, a metal barrier layer, a second doped polysilicon layer and a metal silicide layer on a silicon substrate;
   forming a first silicon nitride spacer with a width of "a" on the metal silicide layer
   removing parts of the metal silicide layer, the second doped polysilicon layer, the metal barrier layer using the first silicon nitride spacer as a hard mask, wherein the first silicon nitride spacer and remaining parts of the metal silicide layer, the second doped polysilicon layer, the metal barrier layer form an upper part of a gate;
   forming a second silicon nitride spacer on a sidewall of the upper part of the gate;
   removing parts of the first doped polysilicon layer and the gate oxide layer using the second silicon nitride spacer as a mask, wherein a remaining part of the first doped polysilcion layer and the underlying gate oxide layer form a lower part of the gate;
   forming a bit line contact on one side of the gate, wherein the bit line contact is formed above the lower part of the gate; and
   forming a node contact on other side of the gate, wherein the node contact is formed above the lower part of the gate.

14. The method according to claim 13, wherein a width of the upper part of the gate depends on the width of the first silicon nitride spacer.

15. The method according to claim 13, wherein a width of the lower part of the gate depends on the width of the first silicon nitride spacer and a width of the second silicon nitride spacer.

16. The method according to claim 15, wherein the width of the lower part of the gate is greater than the width of the upper part of the gate.

17. The method according to claim 13, wherein after forming a lower part of the gate, the method further includes:
   forming source/drain regions on both sides of the gate in the silicon substrate;
   forming a third doped polysilicon layer on both sides of the gate, wherein the third doped polysilicon layer is adjacent to the lower part of the gate; and
   forming a contacting pad on the third doped polysilicon layer and a sidewall of the upper part of the gate.

18. The method according to claim 17, wherein the bit line contact is electrically connected to the source/drain region via the third doped polysilicon layer.

19. The method according to claim 17, wherein node contact is electrically connected to the source/drain region via the third doped polysilicon layer.

* * * * *